US 6,673,149 B1

(12) United States Patent
Solomon et al.

(10) Patent No.: US 6,673,149 B1
(45) Date of Patent: Jan. 6, 2004

(54) PRODUCTION OF LOW DEFECT, CRACK-FREE EPITAXIAL FILMS ON A THERMALLY AND/OR LATTICE MISMATCHED SUBSTRATE

(75) Inventors: Glenn S. Solomon, Redwood City, CA (US); David J. Miller, Belmont, CA (US); Tetsuzo Ueda, Menlo Park, CA (US)

(73) Assignees: Matsushita Electric Industrial Co., LTD, Osaka (JP); CBL Technologies, Inc., Redwood City, CA (US)

( * ) Notice: Subject to any disclaimer, the term of this patent is extended or adjusted under 35 U.S.C. 154(b) by 0 days.

(21) Appl. No.: 09/656,305

(22) Filed: Sep. 6, 2000

(51) Int. Cl.$^7$ ............................................... C30B 25/18
(52) U.S. Cl. ........................... 117/90; 117/94; 117/95; 117/101; 117/915; 117/952; 117/954
(58) Field of Search ............................ 117/90, 94, 95, 117/101, 915, 952, 954

(56) References Cited

U.S. PATENT DOCUMENTS

| 5,573,742 A | 11/1996 | Gebhardt | 423/412 |
|---|---|---|---|
| 5,679,152 A | 10/1997 | Tischler et al. | 117/97 |
| 6,030,886 A | * 2/2000 | Yuri et al. | 438/493 |
| 6,051,849 A | * 4/2000 | Davis | 257/103 |
| 6,146,457 A | * 11/2000 | Solomon | 117/90 |
| 6,165,874 A | * 12/2000 | Powell et al. | 438/478 |
| 6,177,688 B1 | * 1/2001 | Linthicum et al. | 257/77 |
| 6,232,289 B1 | * 7/2001 | Zheleva | 438/478 |
| 6,441,393 B2 | * 8/2002 | Goetz et al. | 257/113 |
| 2002/0064675 A1 | * 5/2002 | Solomon et al. | 428/627 |

* cited by examiner

Primary Examiner—Robert Kunemund
(74) Attorney, Agent, or Firm—JDI Patent; Joshua D. Isenberg

(57) ABSTRACT

A method for the production of a crack-free epitaxial film having a thickness greater than that which can be achieved by continuous epitaxial crystal growth. This epitaxial film can be used as is in a device, used as a substrate platform for further epitaxy, or separated from the initial substrate material and used as a free-standing substrate platform. The method utilizes a defect-rich initial layer that absorbs epitaxially derived stresses and another layer, which is not defect-rich, which planarizes the crystal growth front, if necessary and provides high quality epitaxial region near the surface.

22 Claims, 14 Drawing Sheets at growth temperature at room temperature

First, defect-rich or rough GaN growth, at growth temperature.

Second, high quality or flat GaN growth, after cooling down. No cracks in GaN or substrate.

Removal of the sapphire substrate.

First, very thin, low temperature GaN growth, followed by ramping up growth temperature.

Second, defect-rich or rough GaN growth, at growth temperature.

Third, high quality or flat GaN growth, after cooling down. No cracks in GaN or substrate.

Removal of the sapphire substrate.

Buffer layer structure of a first thin GaN lower layer, patterned layer, and ELOG layer.

Defect-rich or rough GaN layer, at growth temperature.

High quality or flat GaN growth, after cooling down. No cracks in GaN or substrate.

Removal of the sapphire substrate and part of the buffer layer structure.

First defect-rich or rough GaN growth, after cooling down. No cracks in GaN or substrate.

Removal of the sapphire substrate.

Second high quality or flat GaN growth.

Thin, low temperature GaN growth, followed by ramping up growth temperature.

Defect-rich or rough GaN growth, after cooling down. No cracks in GaN or substrate.

Removal of the sapphire substrate.

High quality or flat GaN growth.

Buffer layer structure with first thin GaN lower layer, patterned middle layer, and second GaN upper layer.

Defect-rich or rough GaN layer, after cooling down. No cracks in GaN or substrate.

Removal of the sapphire substrate and part of the buffer layer structure.

High quality or flat GaN growth.

PRODUCTION OF LOW DEFECT, CRACK-FREE EPITAXIAL FILMS ON A THERMALLY AND/OR LATTICE MISMATCHED SUBSTRATE

FIELD OF THE INVENTION

This invention relates to the heteroepitaxial deposition of high quality, epitaxial, crack-free, low defect density films onto a thermally and/or lattice mismatched substrate. More specifically, it relates to the heteroepitaxial deposition of thick layers of compound semiconductor materials for subsequent use as substrates for further deposition. More specifically, it relates to the deposition of thick films of Gallium Nitride (GaN) and other Group III Nitrides (AlN, InN) and their alloys, for use as substrate material for further growth of device structures.

BACKGROUND

Gallium nitride (GaN) has been recognized as having great potential as a technological material. For example, GaN is used in the manufacture of blue light emitting diodes, semiconductor lasers, and other opto-electronic devices, as well as in the fabrication of high-temperature electronics devices.

One of the greatest challenges for the large-scale production of GaN-based devices is the lack of a suitable native GaN substrate or even thick layers of GaN. GaN is not found in nature; it cannot be melted and pulled from a boule like silicon, gallium arsenide, sapphire, etc., because at reasonable pressures its theoretical melting temperature exceeds its dissociation temperature. However, the fabrication of very high crystal quality, thin layers of GaN, and its related alloys, for use in electronic devices, requires that they be deposited homoepitaxially onto an existing GaN surface. Such high quality device layers cannot be directly grown heteroepitaxially, for reasons that are outside the scope of this invention.

The techniques currently in use for the fabrication of high quality GaN and related layers involve the heteroepitaxial deposition of a GaN device layer onto a suitable but non-ideal substrate. Currently such substrates include (but are not limited to) materials such as sapphire, silicon, silicon carbide, and gallium arsenide. All heteroepitaxial substrates present challenges to the high-quality deposition of GaN because of lattice and thermal mismatch. Lattice mismatch is caused by the difference in interatomic spacing of atoms in dissimilar crystals. Thermal mismatch is caused by differences in the coefficient of thermal expansion (CTE) between joined dissimilar materials, as the temperature is raised or lowered.

The most commonly used heteroepitaxial substrate for GaN deposition is sapphire ($Al_2O_3$), which has both a large thermal mismatch and a large lattice mismatch with GaN. For reasons unrelated to the scope of this invention, it otherwise possesses superior properties as a hetero-substrate. However, the large lattice mismatch results in films that have very high defect densities, specifically in the form of dislocations, which are especially undesirable from a device fabrication point of view. As with other epitaxial crystal growth processes, it is necessary to grow a buffer layer of GaN on the sapphire surface prior to the formation of device-quality layers. The buffer layer will vary, depending on device tolerance to dislocations, whether or not special growth techniques (such as growth through a mask pattern, use of low temperature buffer layers, etc.) are employed, as well as other factors. Typically, this GaN buffer thickness is several microns. Defect densities, however, predominantly in the form of dislocations, remain high ($\sim 10^{10} cm^{-2}$) resulting in diminished device quality. In addition, the sapphire substrate is not electrically conductive, and has poor thermal conductivity, limiting its heat sinking capabilities, further reducing device performance and complicating device processing.

A simple solution to this problem is to increase the GaN buffer layer thickness in the hopes that the dislocation density will decrease with increasing distance from the substrate interface. Furthermore, a thick GaN buffer layer offers improved electrical and thermal properties, which aids in the design and processing of devices. These very thick GaN buffer layers have been called 'pseudo-substrates'. The difficulty in growing a sufficiently thick GaN buffer layer on sapphire, to act as a pseudo-substrate for subsequent device-quality layer growth, arises from the effects of thermal mismatch. Typically the GaN is deposited onto the sapphire at a temperature of between 1000–1100° C.; as the sample cools to room temperature, the difference in thermal expansion (also contraction) rates gives rise to high levels of stress at the interface between the two materials. Sapphire has a higher coefficient of thermal expansion (CTE) than does GaN; as it cools, the mismatch at the interface puts the GaN under compression and the sapphire under tension. Up to a point, the amount of stress is directly related to the thickness of the deposited GaN, such that the thicker the film, the greater the stress. Above a film thickness of approximately 10 microns, the stress levels exceed the fracture limits of the GaN, and cracking and peeling of the film results. Cracks in this layer are much less desirable than high dislocation densities, and should be avoided because of the risk of their catastrophic propagation into the device layer during subsequent processing steps.

Referring to the drawings, FIGS. 1(a)–(b) schematically illustrate the prior art when deposition of a thick layer of GaN onto sapphire is desired. In FIG. 1(a), sapphire substrate 101 has a thick (greater than 10 microns) film of GaN 102 deposited onto it, at the growth temperature, which may be in the range of 1000–1100° C. The actual method of deposition is not relevant to this invention. Because the film of GaN nucleates onto the substrate at this temperature, there is no thermal stress present. FIG. 1(b) shows the effects of the large temperature change as the sample cools to room temperature. In this FIG., sapphire substrate 101 is now under tensile stress and is bent concave with respect to the deposited film. If the stresses are great enough, cracks 103 may be present in the substrate. The epitaxial GaN 102 is under compressive stress, and is cracked, and may also peel away from or otherwise degrade the interface with substrate 101.

FIG. 2 schematically represents a series of steps involved in the conventional method for making a thick layer on a thermally and/or lattice mismatched substrate. Step 201 calls for the provision of a prepared substrate. This prepared substrate may be, for example, plain sapphire, chemically cleaned prior to use. Step 202 is the setting of process parameters and growth conditions for the growth of the thick, flat, high quality layer. Step 203 calls for the deposition of the thick layer onto the prepared substrate. The thickness of this layer is preferentially in the range of 10–400 microns. In step 204, the sample is cooled down to room temperature where it is removed, intact, from the reactor. The wafer is bowed due to the residual stress caused by the thermal mismatch between the epitaxial layer and the substrate. This stress also leads to the formation of many cracks in the thick layer and the substrate.

Therefore, a need exists in the art for arbitrarily thick, high quality, epitaxial, crack-free, low defect density films deposited onto thermally and/or lattice mismatched substrates and a method for depositing them.

SUMMARY OF THE INVENTION

The present invention provides a method to allow the growth of an arbitrarily thick, crack-free layer of GaN or related III–V compound or alloy onto a heteroepitaxial substrate. Additionally, it is another object of this invention to provide a method for the growth of such a film with a top surface having significantly fewer defects than are present at the interface of the GaN film and the heteroepitaxial substrate. Additionally, it is another object of this invention to provide a method for the production of a freestanding substrate of GaN, AlN, InN or their alloys.

It is another object of the present invention to provide a method for the production of a defect-rich first heteroepitaxial layer, which is essentially stress-free, and a subsequent second homoepitaxial layer, atop the first layer, that is of a very high crystal quality.

It is another object of the present invention to provide a method for the production of a defect-rich first heteroepitaxial layer, which is essentially stress-free, and the formation, in-situ, of a subsequent second homoepitaxial layer, atop the first layer, that is of a very high crystal quality.

It is another object of the present invention to describe a method for the production of 1) a highly defect-rich, stress-relieved first layer, followed by 2) the deposition of a second layer atop the first layer; where 2) acts to cover, isolate, and eliminate the effects of the defects in layer 1).

These and other objects, advantages, and features of the invention will be set forth in part in the description which follows, and in part will become apparent to those having ordinary skill in the art upon examination of the following, or may be realized and attained as particularly pointed out in the appended claims.

DETAILED DESCRIPTION OF THE PREFERRED EMBODIMENTS

For purposes of illustration, the present invention will be described primarily in relation to the fabrication of a thick layer of GaN on a sapphire substrate, using a suitable growth technique such as hydride vapor phase epitaxy (HVPE). It should be understood, however, that the present invention is applicable to the deposition of materials including GaN, AlN, InN and/or their alloys, and/or onto substrates other than sapphire, and/or using other deposition techniques (such as metal organic chemical vapor deposition (MOCVD), molecular beam epitaxy (MBE), sputtering, evaporation, etc.). Although, for the purpose of example, the following embodiments are described with respect to GaN substrates, the invention is not limited to just GaN substrates. Those skilled in the art will recognize that the process is equally applicable to producing substrates of other group III nitrides and other III–V compounds.

FIRST EMBODIMENT

Figure 1A:
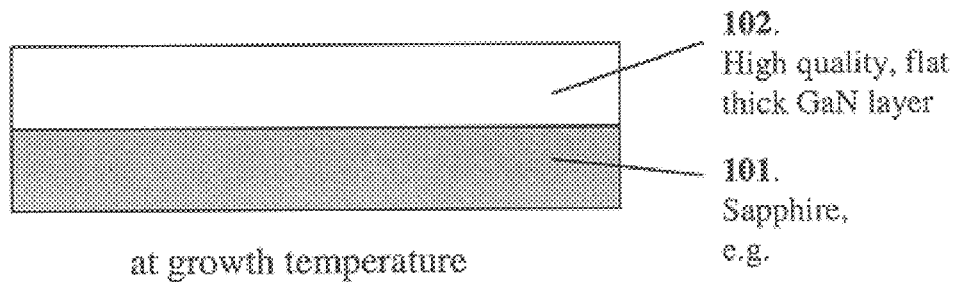
FIGS. 1(a)–1(b) are cross sectional schematic views showing conventional (prior art) heteroepitaxial growth of thick GaN on sapphire.
Figure 1B:
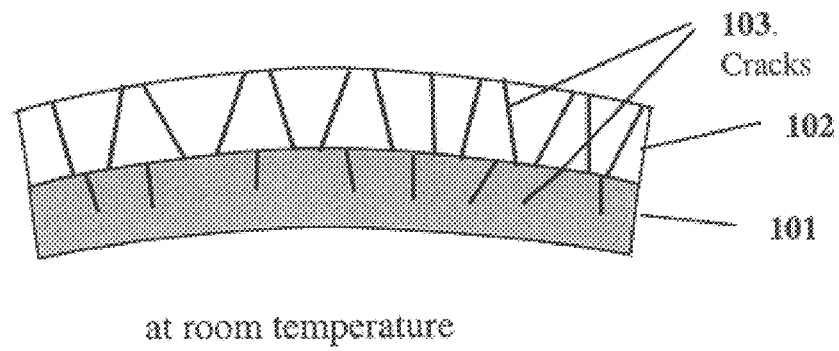
Figure 2:
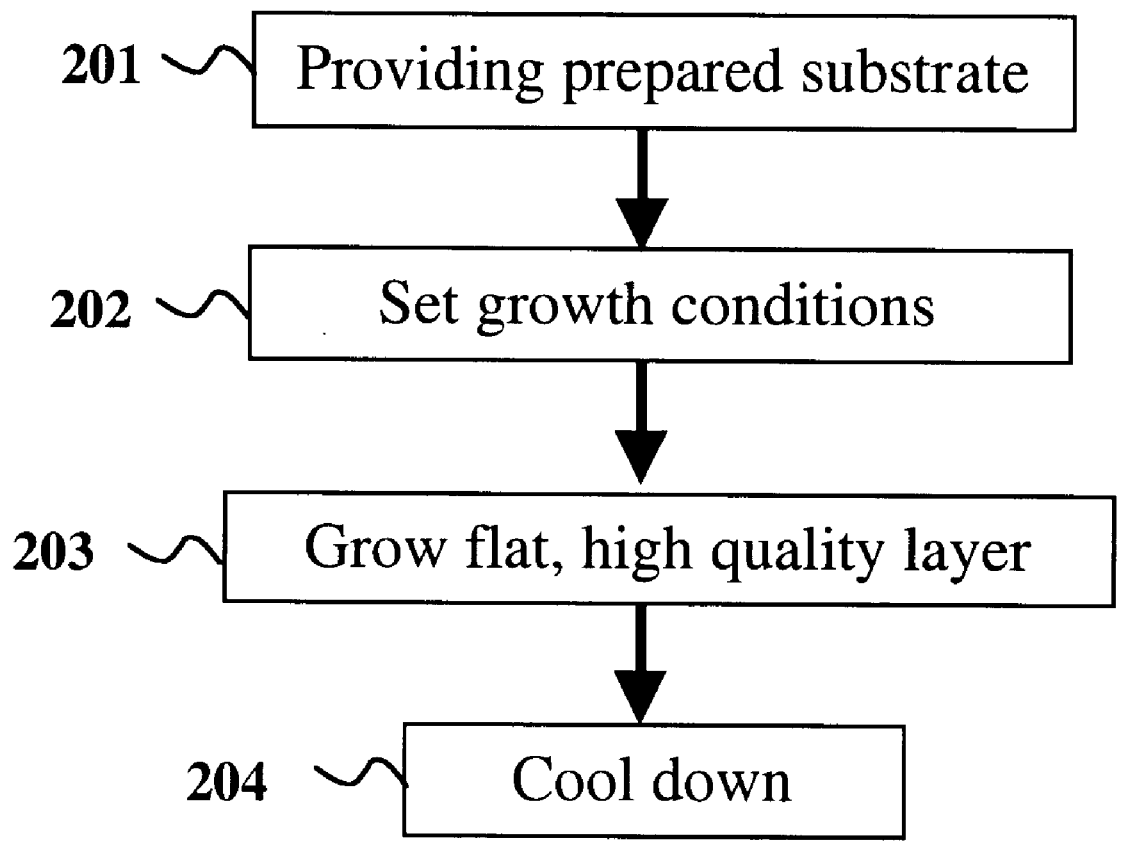
FIG. 2 schematically shows the process steps for conventional thick heteroepitaxial growth of thick GaN.
Figure 3A:
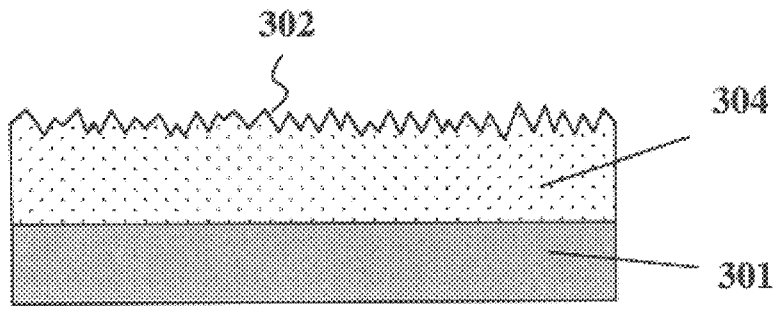
FIGS. 3(a)–3(c) are cross sectional schematic views showing heteroepitaxial growth of thick and/or freestanding GaN according to a first embodiment of the invention.
Figure 3B:
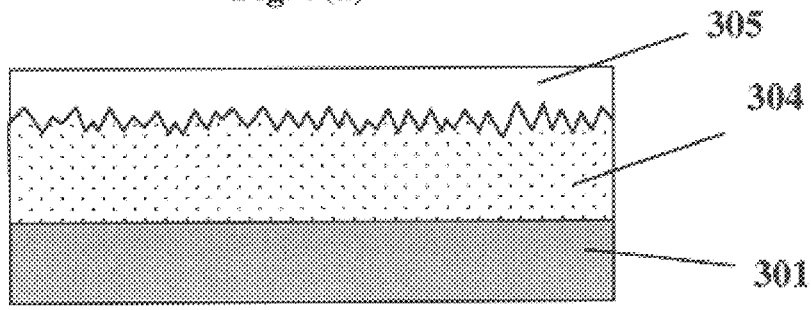
Figure 3C:
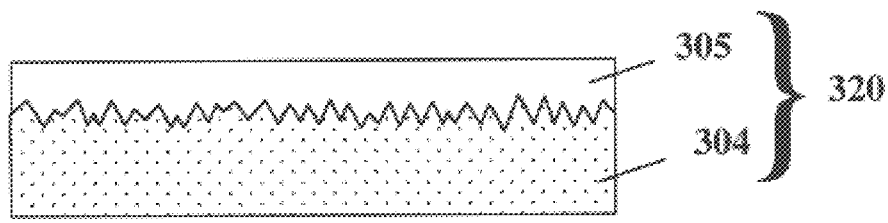

FIGS. 3(a)–3(c) schematically depict the growth of a thick, crack-free layer of a group III nitride, e.g., GaN onto sapphire, according to the first embodiment of this invention. In FIG. 3(a), a first, thick, defect-rich or very rough GaN layer 304 is grown by VPE or other related technique (e.g., HVPE, MOCVD, etc.) onto a substrate 301. The substrate 301 may be made of sapphire, a III–V substrate, gallium arsenide, indium phosphide, gallium phosphide, zinc oxide, magnesium oxide, silicon, a silicon oxide, silicon carbide, lithium aluminate, lithium gallate, and/or lithium aluminum gallate. The GaN layer 304 may be grown, for example, by adjusting the growth parameters or material composition during growth to form crystalline facets 302. Subsequently, a second high quality or very flat GaN layer 305 is grown onto the first GaN layer 304 by HVPE as shown in FIG. 3(b). After the second growth, the wafer is cooled down to room temperature. Thermal mismatch-induced cracks do not form while cooling because the first GaN layer 304 alleviates the residual stress between the second epitaxial GaN layer 305 and the substrate 301. The first layer 304 and second layer 305 form a heteroepitaxial layer 320. Layer 320 is typically greater than about 35 μm thick. The substrate 301 may be removed by polishing, or some other technique, as shown in FIG. 3(c).

Figure 4:
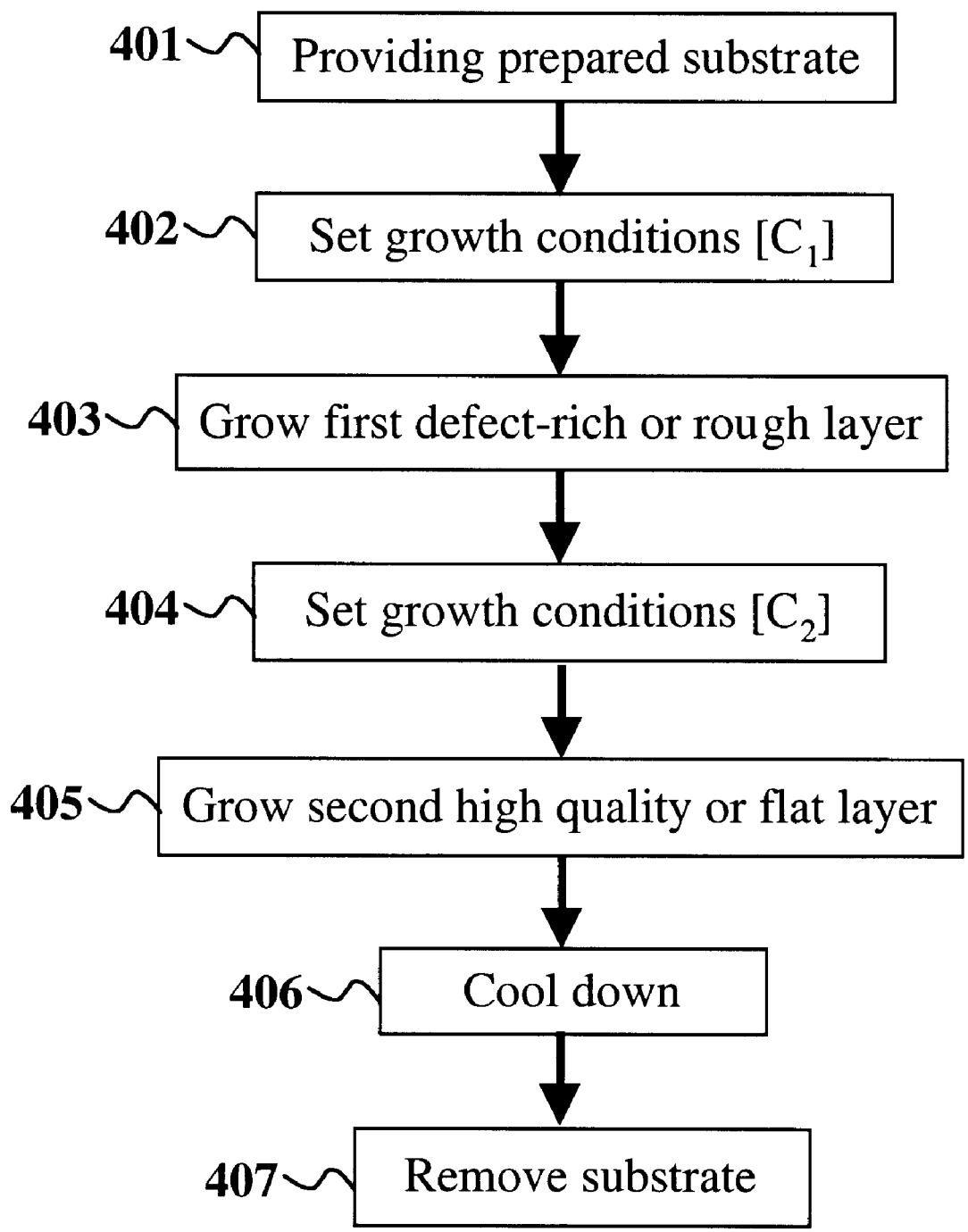
FIG. 4 schematically shows the process steps for the heteroepitaxial growth of thick and/or freestanding GaN of the first embodiment of the invention.

FIG. 4 schematically shows the series of steps involved in a method for making a thick layer on a thermally and/or lattice mismatched substrate, according to the first embodiment of this invention. Step 401 calls for the provision of a prepared substrate. In Step 402, the process parameters for the growth of the first layer are set are set. For the purpose of ease of reference, all process parameters and growth conditions are placed into a set, denoted as $[C_1]$. Process parameters $[C_1]$ include all relevant parameters regarding the growth conditions for the deposition of the first layer, i.e. layer 302. $[C_1]$ includes process conditions such as reactor pressure, reactor geometry, reactor temperature(s), reactor temperature gradient(s), substrate temperature, gas flow rates, etc. used for the deposition of this thick layer. These differences may include, but are not limited to, changes in substrate or reactor temperatures, pressures, gas flow rates or ratios, and reactor geometry, for example. Step 403 calls for the growth of the defect-rich or rough first layer onto the prepared substrate. The thickness of this layer is preferentially in the range of 10–300 microns. The conditions $[C_1]$ are such that the material deposited will have a high defect density or surface roughness, yet will remain essentially epitaxial in nature. Exemplary parameters $[C_1]$ are typically as follows. The growth rate of layer 302 is typically between about 50 and 200 microns/hr, preferably about 100 microns/hr. The temperature of substrate 301 is typically between about 1000° C. and about 1070° C. preferably about 1030° C. A ratio of the flow of group V material to group III material, denoted herein as V/III ratio is typically between about 50 and about 250, preferably about 125. The reactor pressure is typically between about 0.9 atmospheres and 1.5 atmospheres, preferably slightly above 1 atmosphere (1 atmosphere is approximately equal to 14.7 lbs/in$^2$ at sea level).

Step 404 calls for the changing of growth conditions to $[C_2]$, which may be different from $[C_1]$ in terms of temperature, pressure, reactor geometry, flow rates, etc. Depending on the materials and type of deposition system in use, the parameters in set $[C_1]$ used in the same reactor for the deposition of a defect-rich or rough layer, e.g. layer 304, will differ from those used for the deposition of a second low defect density or flat layer, $[C_2]$. Step 405 calls for the deposition of the second, high quality, low defect or flat layer, e.g. layer 305 atop the first layer 302, using the growth conditions $[C_2]$. Exemplary parameters $[C_2]$ are typically as follows. A growth rate of layer 305 is typically between about 5 and 50 microns/hr, preferably about 25 microns/hr. The substrate temperature is typically between about 1000° C. and about 1070° C. preferably about 1030° C. The reactor pressure is typically between about 0.9 atmospheres and 1.5 atmospheres, preferably slightly above 1 atmosphere. The V/III ratio is typically between about 50 and about 250, preferably about 125.

This second layer covers the first, burying and isolating the defects, which do not propagate upward during growth. Alternatively, the second layer may be grown under conditions favoring lateral epitaxial growth, resulting in growth that smoothes and fills in surface irregularities in the first layer. The thickness of this second layer is preferentially in the range of 10–300 microns. In step 406, the sample is cooled down to room temperature without the formation of cracks in the thick epitaxial layer or substrate; the residual stress is minimized due to the effect of the first layer. The epitaxial quality of the top surface of the film is very high, having been grown using high quality—high stress growth conditions. The deposited film has substantially reduced thermal stress, however, as it is relieved by the defects and/or roughness of the first layer, below. The result is a thick layer of low stress, crack-free material on a thermally and/or lattice mismatched substrate, such as GaN on sapphire. In some cases, as shown in step 407 in FIG. 4, the sapphire substrate is removed after cooling down, e.g. leaving heteroepitaxial layer 320 as a freestanding GaN substrate.

It is possible to vary the process described in the above embodiment without departing from the scope of the invention In an alternative process the growth rate may he kept constant and the temperature of substrate 301 may be raised from a rough growth regime to a smooth growth regime. Another alternative is a flux between the two "extremes", i.e. reducing growth rate and increasing temperature slightly.

In the following embodiments of the present invention, the growth of a defect-rich or rough thick layer and subsequent growth of a high quality or smooth layer are common steps for the production of crack-free, high quality thick epitaxial layers. The following embodiments highlight additional process steps or variations on methods used to achieve this same goal.

SECOND EMBODIMENT

Figure 5A:
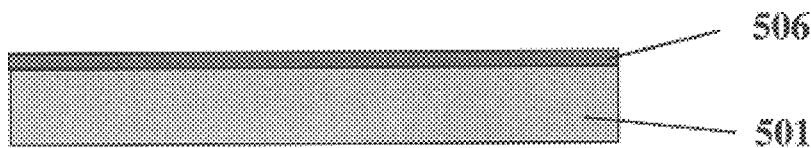
FIGS. 5(a)–5(d) are cross sectional schematic views showing the heteroepitaxial growth of thick and/or freestanding GaN according to a second embodiment of the invention.
Figure 5B:
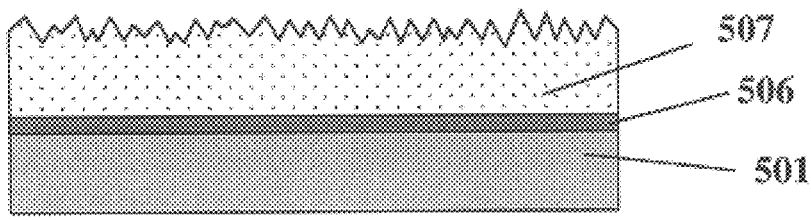
Figure 5C:
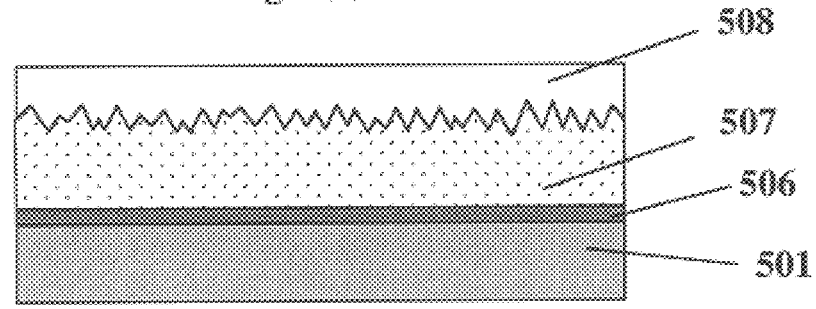
Figure 5D:
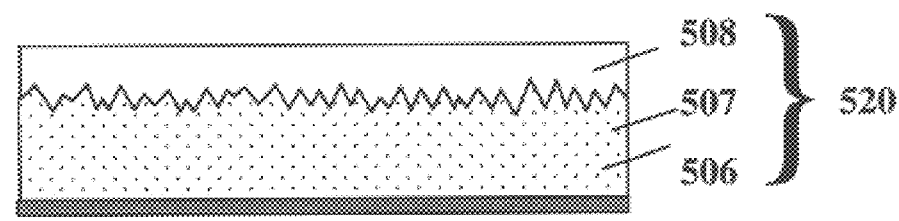

FIGS. 5(a)–5(d) schematically show the growth of a thick, crack-free layer of GaN onto sapphire according to the second embodiment of this invention. In FIG. 5(a), a very thin buffer layer 506, e.g. of GaN, may be grown on a substrate 501 by a vapor phase epitaxy technique such as metal organic chemical vapor deposition (MOCVD) or hydride vapor phase epitaxy (HVPE). The substrate may have features in common with substrate 301 of FIG. 3 and may be made of the same types of materials. Typically, the buffer thickness is on the order of 50 nm and is grown at a lower temperature than the subsequent HVPE growths. The buffer may also be of AlN, InN or an alloy of AlN, GaN and/or InN, ZnO, or MgO. Multiple layers of differing compositions may also be used instead of a single buffer layer. In such cases the buffer layer may be thicker than 50 nm, and may even consist of multiple MOCVD layers grown at different temperatures. For example, a low temperature buffer consisting of one or more layers, followed by the higher temperature growth of one or more additional layers, and possibly an additional low temperature layer, are within the scope of the present invention. The buffer may be used to help reduce interfacial stress caused by lattice and/or thermal mismatch, but it may also be used to assist in the nucleation and growth of subsequent GaN layers. Following the buffer growth is the deposition of a thick, defect-rich or very rough HVPE second layer 507, as shown in FIG. 5(b). Subsequently, a high quality or very flat HVPE GaN third layer 508 is grown onto the HVPE GaN second layer 507, as shown in FIG. 5(c). After. the third growth, the wafer is cooled down to room temperature. Thermal mismatch-induced cracks do not form while cooling because the second GaN layer 507 alleviates the residual stress between the third epitaxial GaN layer 508 and the sapphire substrate 501. The sapphire substrate 1 may be removed by polishing, or some other technique, as shown in FIG. 5(d). Layers 506, 507, and 508 then form a free standing substrate 520.

Figure 6:
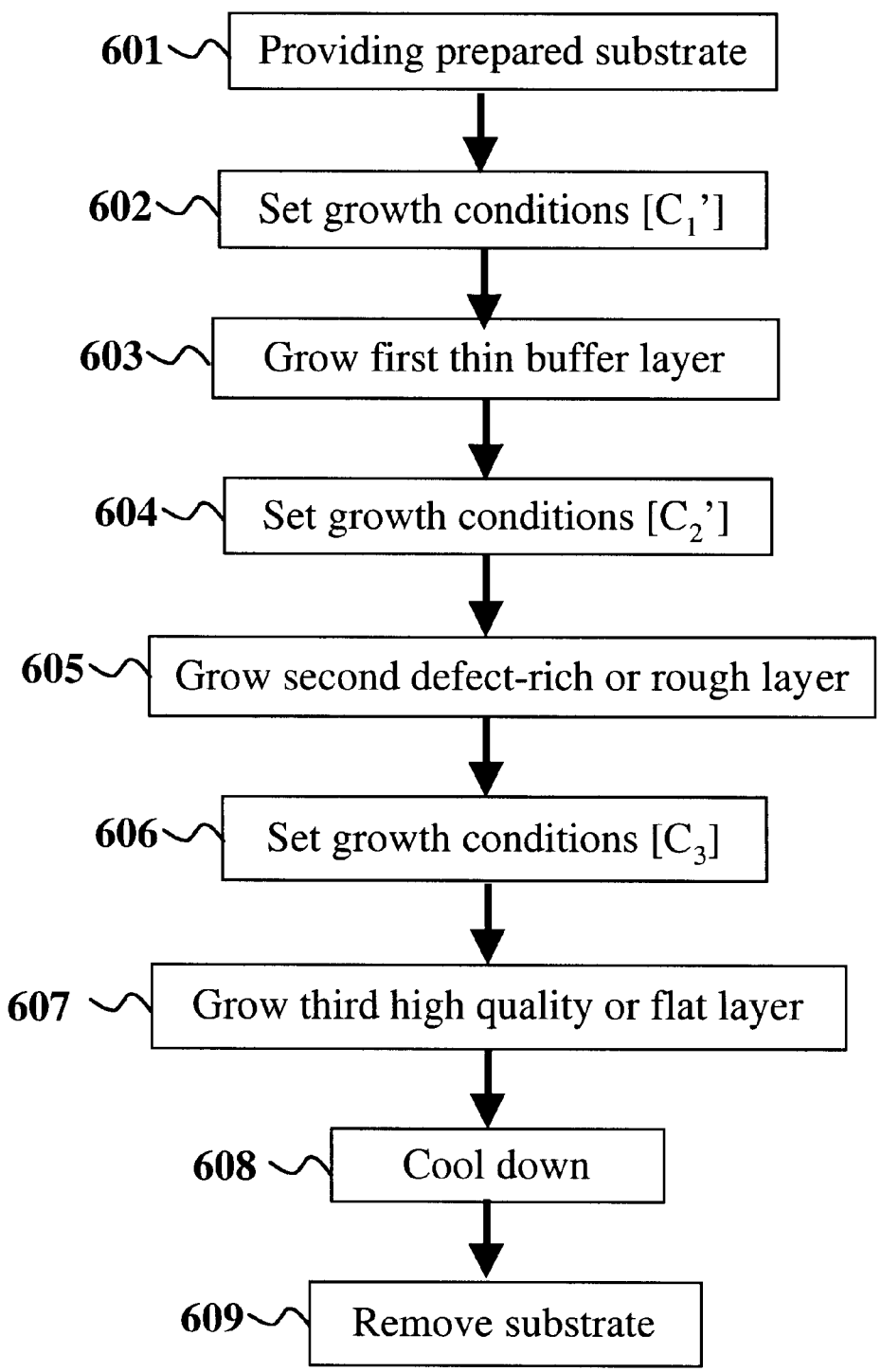
FIG. 6 schematically shows the process steps for the heteroepitaxial growth of thick and/or freestanding GaN in the second embodiment of the invention.
Figure 7A:
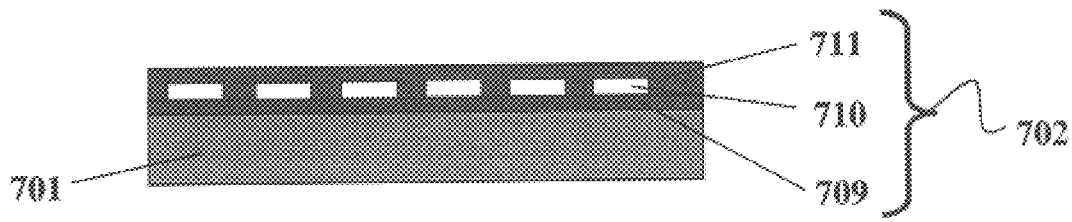
FIGS. 7(a)–7(d) are cross sectional schematic views showing the heteroepitaxial growth of thick and/or freestanding GaN according to a third embodiment of the invention.
Figure 7B:
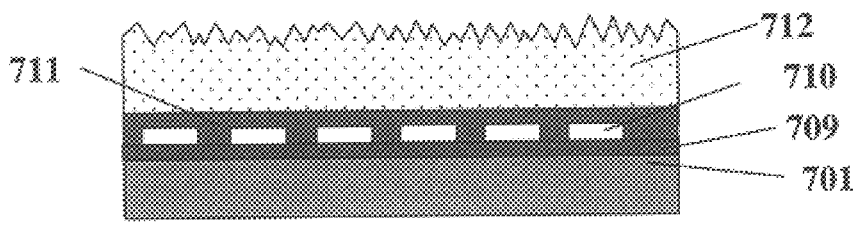
Figure 7C:
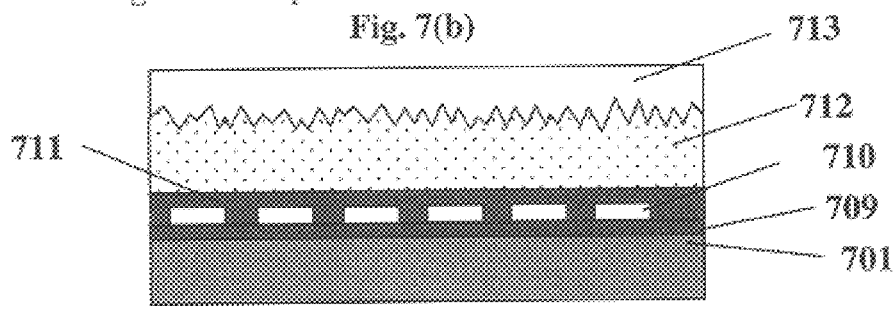
Figure 7D:
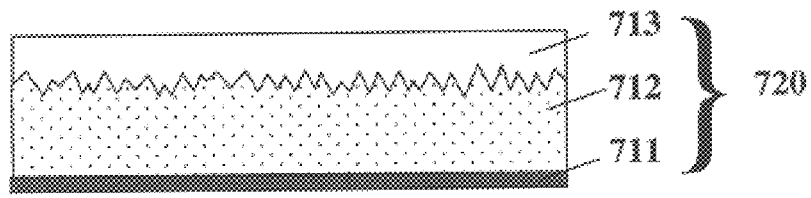

FIG. 6 schematically shows the series of steps involved in a method for making a thick layer on a thermally and/or lattice mismatched substrate, according to the second embodiment of this invention Step 601 calls for the provision of a prepared substrate. In Step 602, the process parameters for the growth of the buffer layer (or layers) are set, hereby denoted as $[C_1']$. As mentioned previously, $[C_1']$ contains all relevant parameters regarding the growth conditions for the deposition of the buffer layer (or layers). In the case of a buffer consisting of multiple layers, the process conditions set [$C_1'$] may consist of multiple unique sub-sets, one for each individual layer of the buffer structure. Exemplary parameters [$C_1'$] are typically as follows. Buffer layer 506 is typically to a thickness of between about 5 and 100 nm, preferably about 30 nm. A growth rate of buffer layer 506 is typically between about 0.1 and 1.0 microns/hr, preferably about 0.4 microns/hr. The substrate temperature is typically between about 400° C. and about 700° C. preferably about 500° C. The reactor pressure is typically between about 0.9 atmospheres and 1.5 atmospheres, preferably slightly above 1 atmosphere. The V/III is typically between about 4000 and about 7000, preferably about 5500.

Step 603 calls for the growth of the buffer layer (or layers) onto the prepared substrate, with a total thickness on the order of 50 nm. In Step 604 growth conditions are changed to [$C_2'$]. This may involve the use of a different growth technique than that used in Step 603, and possibly even the use of a different growth system, which may require an additional set of steps for unloading and loading of the sample. Step 605 calls for the growth of a defect-rich or rough second layer onto the buffer layer. The thickness of this layer is preferentially in the range of 10–300 microns. The conditions [$C_2'$] are such that the material deposited will have a high defect density or surface roughness, yet will remain essentially epitaxial in nature. The process conditions [$C_2'$] are typically in the same ranges as those set forth in set [$C_1$] described above with respect to FIG. 4. In Step 606 the growth conditions are set to [$C_3$], which may be different from [$C_2'$] in terms of temperature, pressure, reactor geometry, flow rates, etc. Step 607 calls for the deposition of the third, high quality, low defect or flat layer, e.g. layer 508 atop the second layer, 506 using the growth conditions [$C_3$]. The process conditions [$C_3$] are typically in the same ranges as those set forth in Set [$C_2$] described above with respect to FIG. 4. This third layer covers the second, burying and isolating the defects, which do not propagate upward during growth. Alternatively, the third layer may be grown under conditions favoring lateral epitaxial growth, resulting in growth that smoothes and fills in surface irregularities in the second layer. The thickness of this third layer is preferentially in the range of 10–300 microns.

In step 608, the sample is cooled down to room temperature without the formation of cracks in the thick epitaxial layer or substrate; the residual stress is minimized due to the effect of the second layer. The epitaxial quality of the top surface of the film is very high, having been grown using high quality high stress growth conditions. The deposited film has substantially reduced thermal stress, however, as it is relieved by the defects and/or roughness of the second layer, below. The result is a thick layer of low stress, crack-free material on a thermally and/or lattice mismatched substrate, such as GaN on sapphire. In some cases, as shown in step 609 in FIG. 6, the substrate 501 is removed after cooling down, to obtain a freestanding GaN substrate, e.g. substrate 520.

THIRD EMBODIMENT

FIGS. 7(*a*)–7(*d*) schematically shows the growth of a thick, crack-free layer of GaN onto sapphire, according to the third embodiment of this invention. In FIG. 7(*a*), a buffer layer structure 702 is formed on a substrate 701 of the type described above with respect to FIG. 3. The buffer layer structure 702 generally comprises a lower GaN layer 709, a patterned mask layer 710, e.g., of silicon dioxide ($SiO_2$), and an epitaxial lateral overgrowth (ELOG) layer 711. The mask material inhibits GaN growth; growth occurs only in unmasked areas. This serves to enhance lateral overgrowth of the ELOG layer 711, as well as to partially decouple the substrate from this and subsequent epitaxial layers. Such decoupling reduces the residual thermal and/or lattice mismatch stresses in the epitaxial layers, and is achieved by reducing the effective contact area between substrate and epitaxy.

Typically the two GaN layers are grown by a vapor phase epitaxy technique, such as MOCVD or HVPE, and the total thickness of the buffer structure is on the order of one micron, although other growth processes and buffer structure thicknesses are within the scope of the present invention. The individual layers of this structure may also be of different compositions: for example layers 709 and 711 could each consist of GaN, AlN, InN, or an alloy of these constituents. The patterned mask layer 710 could consist of $SiO_2$, silicon nitride ($Si_3N_4$), polysilicon, a refractory metal, or any combination of these components. These are given merely as examples, and are not meant to limit the scope of this embodiment of the present invention; other suitable materials could be used to similar effect. Additionally, each individual layer may consist of a set of sub-layers. Layers 709, 710, and/or 711 may each be composed of two or more layers of distinct composition, to further reduce the residual stress levels or to enhance lateral overgrowth. Typical thickness for the lower layer 709 is on the order of 1 micron; thickness of the patterned mask layer 710 is on the order of 500 nm; thickness of the ELOG layer 711 is on the order of 1–4 microns. Other layer thicknesses that serve to reduce the residual stress or improve the nucleation or lateral overgrowth of layer 711 are also within the scope of this embodiment of the present invention.

Following the growth of buffer layer structure 702 growth is the deposition of a thick, defect-rich or very rough HVPE layer 712, as shown in FIG. 7(*b*). Subsequently, a high quality or very flat HVPE GaN layer 713 is grown onto the third HVPE GaN layer 712, as shown in FIG. 7(*c*). After the growth of layer 713, the wafer is cooled down to room temperature. Thermal mismatch-induced cracks do not form while cooling because of two complementary effects: the third GaN layer 712, reduces the residual stress between the fourth epitaxial GaN layer 713 and the sapphire substrate 701, as described in the first embodiment of the present invention. Additionally, the patterned mask layer 710 and lateral overgrowth layer 711 serve to mechanically decouple thick HVPE layers 712 and 713 from the sapphire substrate 701. The substrate 701 and part of the buffer layer structure 702 may be removed by polishing, or some other technique, as shown in FIG. 7(*d*). Typically the patterned layer and part of the lateral overgrowth layer 711 are removed. The remaining part of the ELOG layer 711 and layer 712, 713 form a free standing group III nitride substrate 720.

Figure 8:
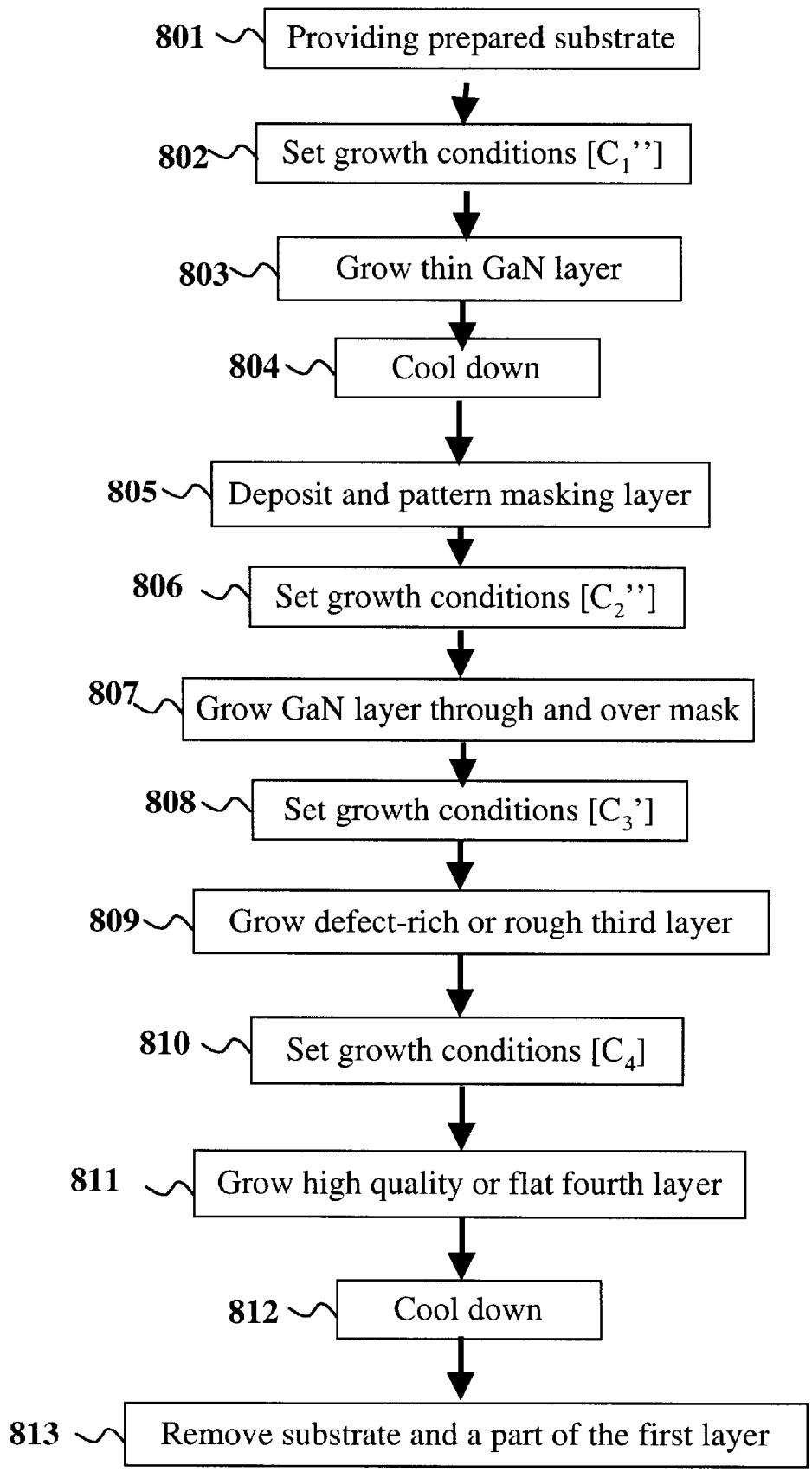
FIG. 8 schematically shows the process steps for the heteroepitaxial growth of thick and/or freestanding GaN in the third embodiment of the invention.

FIG. 8 schematically shows the series of steps involved in a method for making a thick layer on a thermally and/or lattice mismatched substrate, according to the third embodiment of this invention. Step 801 calls for the provision of a prepared substrate. In Step 802, the process parameters for the growth of the first buffer layer (or layers) are set, hereby denoted as [$C_1''$]. Process parameter set [$C_1''$] contains all relevant parameters regarding the growth conditions for the deposition of the first buffer layer (or layers), e.g. layer 709. The process parameters [$C_1''$] are typically in the same ranges as those set forth in [$C_1'$] as described above with respect to FIG. 6. Step 803 calls for the growth of the first buffer layer (or layers) onto the prepared substrate, with a total thickness on the order of 1 micron. In Step 804, the sample is cooled and removed from the reactor. In Step 805, a suitable mask material is deposited onto the sample, after which it is patterned using appropriate methods such as lithography and etching. In step 806 growth conditions are changed to [$C_2$"] for the growth of an ELOG layer (or layers), e.g. ELOG layer 711. The process of reloading the sample into the growth reactor may also be included in parameter set [$C_2$"]. In Step 807 the ELOG layer (or layers) are grown for a typical thickness of 1–10 microns. The parameters [$C_2$"] are typically as follows. If the ELOG layer 711 is grown by HVPE, high growth rate, [$C_2$"] may comprise rough layer parameters such as parameters [$C_1$] described above with respect to FIG. 4. If the ELOG layer 711 is grown by an MOCVD process parameter set [$C_2$"] may be as follows. The substrate temperature may be between about 970° C. and about 1070° C. The reactor pressure is typically less than 1 atmosphere, preferably about 0.1 atmosphere. The growth rate of ELOG layer 711 may be between about 0.5 microns/hr and about 5 microns/hr, preferably about 2 microns/hr. The V/III ratio is typically between about 500 and about 5000, preferably about 1500. The ELOG layer is grown through and over the masking layer below it, reducing the effective contact area between the epitaxial overgrowth and the sapphire substrate. The ELOG layer 711 reaches top of patterned layer 710 and then expands laterally. Lateral growth normally stops propagation of vertical defects from sapphire GaN interface. In the present invention the second buffer layer also promotes cracking at the interface between substrate 701 and buffer layer structure 702.

In Step 808 the growth conditions are changed to [$C_3$'], which may involve the use of a different growth technique than that used in Step 806, possibly even the use of a different growth system, which may require an additional set of steps for unloading and loading of the sample. Step 809 calls for the growth of a defect-rich or rough third layer, e.g., layer 712 onto the buffer layer. The thickness of this layer is preferentially in the range of 10–300 microns. The parameters in [$C_3$'] are typically in the same ranges as those described with respect to [$C_1$] of FIG. 4. The conditions [$C_3$'] are such that the material deposited will have a high defect density or surface roughness, yet will remain essentially epitaxial in nature.

In Step 810 the growth conditions are set to [$C_4$], which may be different from [$C_3$'] in terms of temperature, pressure, reactor geometry, flow rates, etc. Step 811 calls for the deposition of the fourth, high quality, low defect or flat layer, e.g., layer 713, atop the third layer, using the growth conditions [$C_4$]. The parameters in [$C_4$] are typically in the same ranges as those described with respect to [$C_2$] of FIG. 4. This fourth layer covers the third, burying and isolating the defects, which do not propagate upward during growth. Alternatively, the fourth layer may be grown under conditions favoring lateral epitaxial growth, resulting in growth that smoothes and fills in surface irregularities in the third layer. The thickness of this fourth layer is preferentially in the range of 10–300 microns. In step 812, the sample is cooled down to room temperature, without the formation of cracks in the thick epitaxial layer or substrate; the residual stress is minimized due both to the effects of the third layer, as described in the first embodiment of the present invention, as well as the effects of the masking and overgrowth layers, which reduce the contact between the substrate and the thick epitaxy. The epitaxial quality of the top surface of the film is very high, having been grown using high quality—high stress growth conditions, safely isolated from the effects of the sapphire substrate. The result is a thick layer of low stress, crack-free material on a thermally and/or lattice mismatched substrate, such as GaN on sapphire. In some cases, as shown in step 813 in FIG. 8, the sapphire substrate is removed after cooling down, to obtain a freestanding GaN substrate, e.g. freestanding substrate

FOURTH EMBODIMENT

Figure 9A:
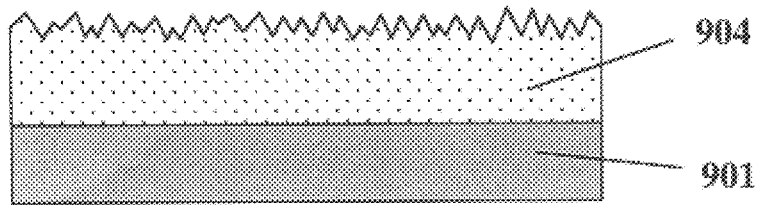
FIGS. 9(a)–9(c) are cross sectional schematic views showing the heteroepitaxial growth of thick and/or freestanding GaN according to a fourth embodiment of the invention.
Figure 9B:
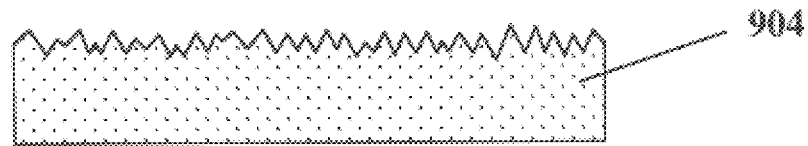
Figure 9C:
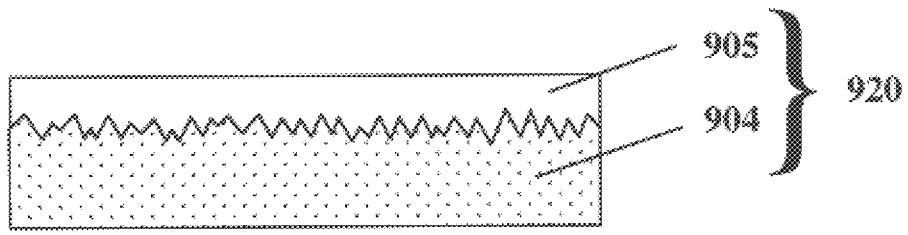

FIGS. 9(*a*)–9(*c*) schematically show the growth of a thick, crack-free freestanding GaN substrate, according to the fourth embodiment of this invention. In FIG. 9(*a*), a first, thick, defect-rich or very rough GaN layer 904 is grown by HVPE onto a sapphire substrate 901. After this layer is grown, the sample is cooled to room temperature, removed from the reactor, and sapphire substrate 901 is removed by polishing or some other technique, as shown in FIG. 9(*b*). Thermal mismatch-induced cracks do not form while cooling because the defect-rich or very rough GaN layer 904 is able to accommodate the stress without cracking. Subsequently, the now freestanding GaN layer is reloaded into the reactor and a second high quality or very flat GaN layer 905 is grown onto the first GaN layer 904 by HVPE as shown in FIG. 9(*c*). This second layer 905 is grown homoepitaxially; freed of the thermal and lattice mismatch constraints imposed by the sapphire substrate 901, the film does not crack or experience thermal stress upon cooling down. The result is a high quality freestanding GaN substrate 920.

Figure 10:
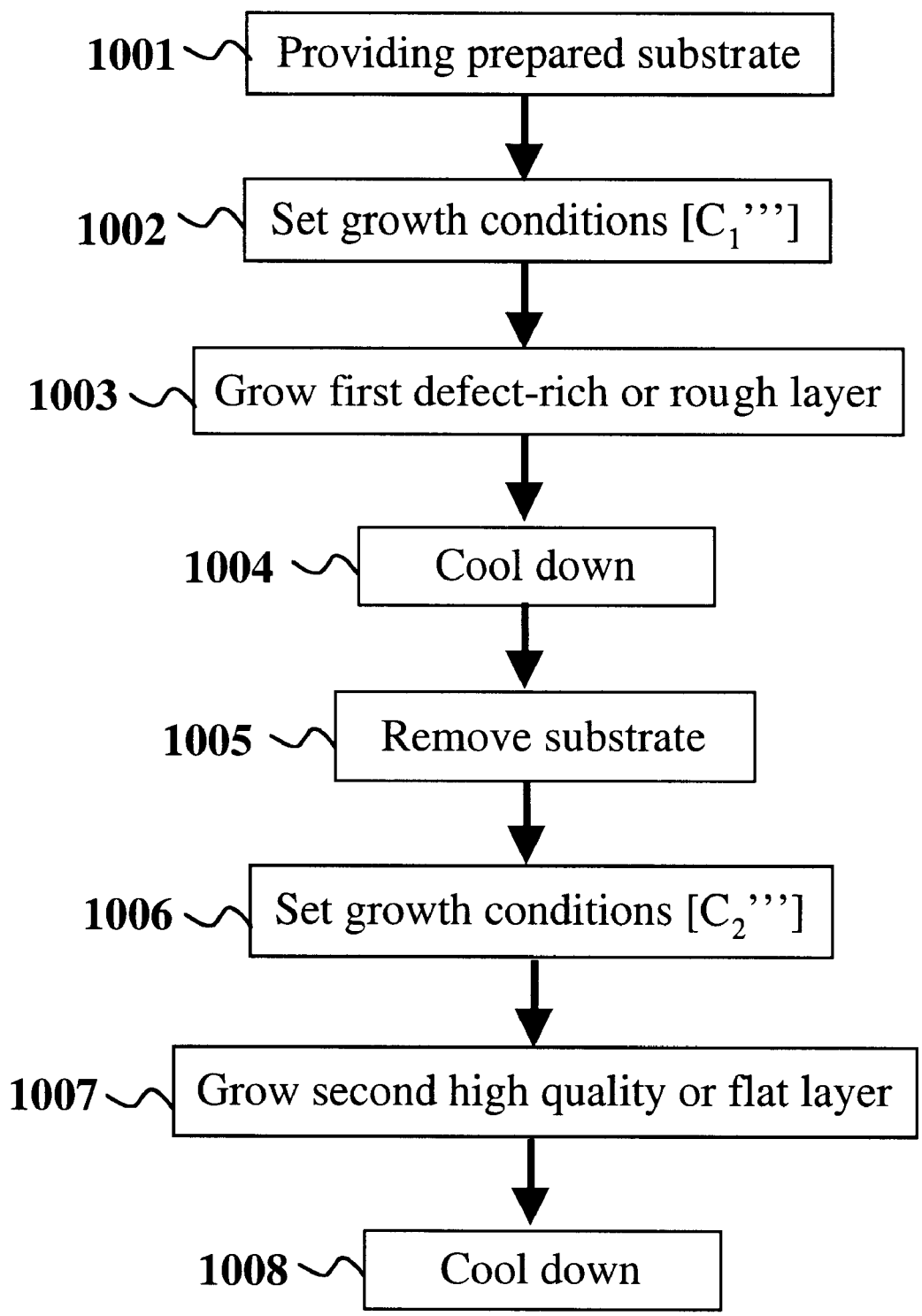
FIG. 10 schematically shows the process steps for the heteroepitaxial growth of thick and/or freestanding GaN in the fourth embodiment of the invention.
Figure 11A:
FIGS. 11(a)–11(d) are cross sectional schematic views showing the heteroepitaxial growth of thick and/or freestanding GaN according to a fifth embodiment of the invention.
Figure 11B:
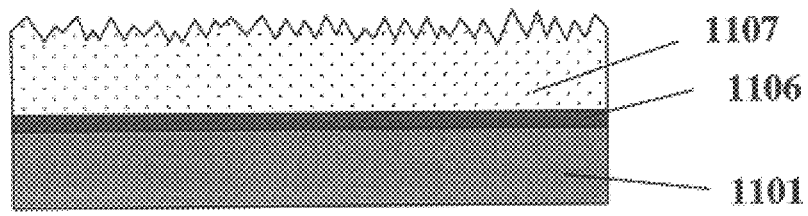
Figure 11C:
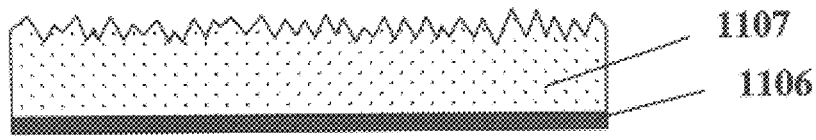
Figure 11D:
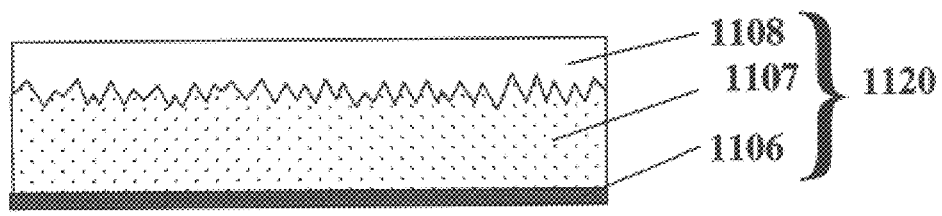

FIG. 10 schematically shows the series of steps involved in a method for making a thick a thick, crack-free freestanding GaN substrate, according to the fourth embodiment of this invention. Step 1001 calls for the provision of a prepared substrate. In Step 1002, the process parameters for the growth of the first III–V layer, e.g. layer 904, are set, hereby denoted as [$C_1'''$]. As mentioned previously, [$C_1'''$] contains all relevant parameters regarding the growth conditions for the deposition of the first layer. Step 1003 calls for the growth of the defect-rich or rough first layer onto the prepared substrate. The thickness of this layer is preferentially in the range of 20–300 microns. The conditions [$C_1'''$] are such that the material deposited will have a high defect density or surface roughness, yet will remain essentially epitaxial in nature. The parameters in [$C_1'''$] are typically in the same ranges as those described with respect to [$C_1$] of FIG. 4. In step 1004, the sample is cooled to room temperature without formation of cracks; the residual stress is minimized due to the effect of the defect-rich or rough first layer. Step 1005 calls for the removal of the sapphire substrate to obtain a rough or defect-rich freestanding GaN layer; while the freestanding layer is a single crystal, its defect density and/or roughness make it unsuitable to use as a GaN substrate for device applications. In Step 1006 the growth conditions are changed to [$C_2'''$], which includes a set of steps for reloading the sample into the reactor. Step 1007 calls for the deposition of the second, high quality, low defect or flat layer, e.g. layer 905 atop the first layer, using the growth conditions [$C_2'''$]. The parameters in [$C_2'''$] are typically in the same ranges as those described with respect to [$C_2$] of FIG. 4. This second layer covers the first, burying and isolating the defects, which do not propagate upward during growth. Alternatively, the second layer may be grown under conditions favoring lateral epitaxial growth, resulting in growth that smoothes and fills in surface irregularities in the first layer. The thickness of this second layer is preferentially in the range of 10–300 microns. In step 1008, the sample is cooled down to room temperature without the formation of cracks; there is no thermal mismatch without the presence of the sapphire substrate, which was removed in Step 1005 to form freestanding substrate 920

FIGS. 11(*a*)–1(*d*) schematically shows the growth of a thick, crack-free freestanding GaN substrate, according to the fifth embodiment of this invention. In FIG. 11(*a*), a thin buffer layer 1106 of GaN, may be grown on a substrate 1101 by a vapor phase epitaxy technique such as MOCVD or HVPE. Typically, the buffer thickness is on the order of 50 nm and is grown at a lower temperature than the subsequent HVPE growths. The buffer may also be of AlN, InN or an alloy of AlN, GaN and/or InN, ZnO or MgO. Multiple layers of differing compositions may also be used instead of a single buffer layer. In such cases the buffer layer may be thicker than 50 nm, and may even consist of multiple MOCVD layers grown at different temperatures. For example, a low temperature buffer consisting of one or more layers, followed by the higher temperature growth of one or more additional layers, and even final low temperature layer, are within the scope of the present invention. The buffer may be used to help reduce interfacial stress caused by lattice and/or thermal mismatch, but it may also be used to assist in the nucleation and growth of subsequent GaN layers. Following the buffer growth is the deposition of a thick, defect-rich or very rough HVPE second layer 1107, as shown in FIG. 11(*b*). After this layer is grown, the sample is cooled to room temperature, removed from the reactor, and sapphire substrate 1101 is removed by polishing or some other technique, as shown in FIG. 11(*c*). Thermal mismatch-induced cracks do not form while cooling because the defect-rich or very rough GaN second layer 1107 is able to accommodate the stress without cracking. Subsequently, the now freestanding GaN layer is reloaded into the reactor and a third high quality or very flat GaN layer 1108 is grown onto the second GaN layer 1107 by HVPE as shown in FIG. 11(*d*). This third layer 1108 is grown homoepitaxially; freed of the thermal and lattice mismatch constraints imposed by the sapphire substrate 1101, the film does not crack or experience thermal stress upon cooling down. The result is a high quality freestanding GaN substrate 1120.

Figure 12:
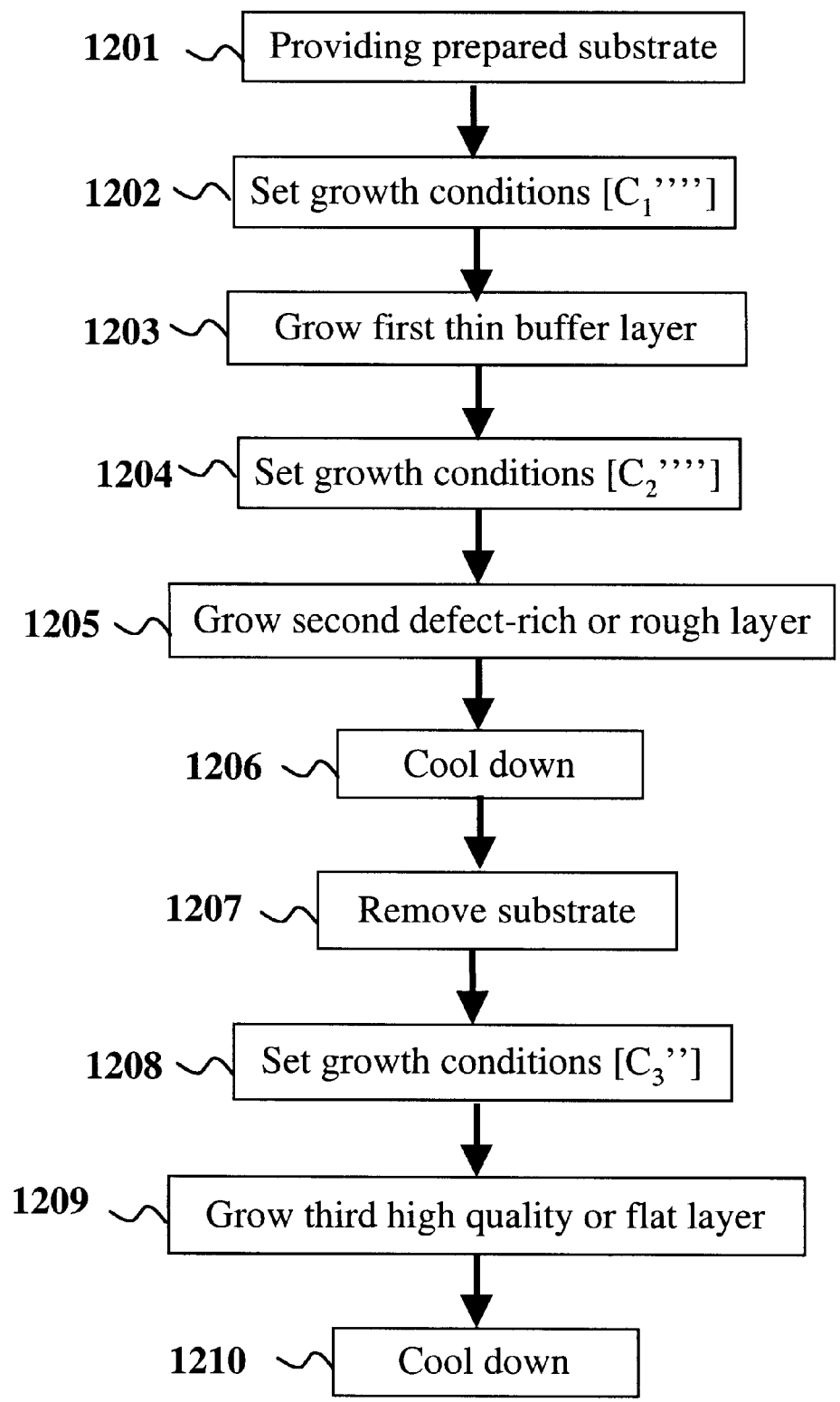
FIG. 12 schematically shows the process steps for the heteroepitaxial growth of thick and/or freestanding GaN in the fifth embodiment of the invention.

FIG. 12 schematically shows the series of steps involved in a method for making a thick, crack-free freestanding GaN substrate, according to the fourth embodiment of this invention. Step 1201 calls for the provision of a prepared substrate. In Step 1202, the process parameters for the growth of the buffer layer (or layers) are set, hereby denoted as $[C_1'''']$. Parameter set $[C_1'''']$ contains all relevant parameters regarding the growth conditions for the deposition of the buffer layer (or layers). In the case of a buffer consisting of multiple layers, the process conditions set $[C_1'''']$ may consist of multiple unique sub-sets, one for each individual layer of the buffer structure. Step 1203 calls for the growth of the buffer layer (or layers), e.g. layer 1106, onto the prepared substrate, with a total thickness on the order of 50 nm. The parameters in $[C_1'''']$ are typically in the same ranges as those described with respect to $[C_1']$ of FIG. 6. In Step 1204 growth conditions are changed to $[C_2'''']$. This may involve the use of a different growth technique than that used in Step 1203, and possibly even the use of a different growth system, which may require an additional set of steps for unloading and loading of the sample. Step 1205 calls for the growth of a defect-rich or rough second layer, e.g. layer 1107 onto the buffer layer. The thickness of this layer is preferentially in the range of 20–300 microns. The parameters in $[C_2'''']$ are typically in the same ranges as those described with respect to $[C_1]$ of FIG. 4. The conditions $[C_2'''']$ are such that the material deposited will have a high defect density or surface roughness, yet will remain essentially epitaxial in nature. In step 1206, the sample is cooled to room temperature without formation of cracks; the residual stress is minimized due to the effect of the defect-rich or rough second layer. Step 1207 calls for the removal of the sapphire substrate to obtain a rough or defect-rich freestanding GaN layer; while the freestanding layer is a single crystal, its defect density and/or roughness make it unsuitable to use as a GaN substrate for device applications. In Step 1208 the growth conditions are changed to $[C_3'''']$, which includes a set of steps for reloading the sample into the reactor. Step 1209 calls for the deposition of the third, high quality, low defect or flat layer, e.g. layer 1108, atop the second layer, using the growth conditions $[C_3'''']$. The parameters in $[C_3'''']$ are typically in the same ranges as those described with respect to $[C_2]$ of FIG. 4. This third layer covers the second, burying and isolating the defects, which do not propagate upward during growth. Alternatively, the third layer may be grown under conditions favoring lateral epitaxial growth, resulting in growth that smoothes and fills in surface irregularities in the second layer. The thickness of this third layer is preferentially in the range of 10–300 microns. In step 1210, the sample is cooled down to room temperature without the formation of cracks; there is no thermal mismatch without the presence of the sapphire substrate, which was removed in Step 1207 to form freestanding substrate 1120.

SIXTH EMBODIMENT

FIGS. 13(*a*)–13(*d*) schematically show the growth of a thick, crack-free freestanding GaN substrate, according to the sixth embodiment of this invention. In FIG. 13(*a*), a buffer layer structure is formed comprising a lower GaN layer 1309, a patterned mask layer of silicon dioxide ($SiO_2$) 1310, and an upper GaN layer 1311. The mask material inhibits GaN growth; growth occurs only in unmasked areas. This serves to enhance lateral overgrowth of the upper GaN layer 1311, as well as to partially decouple the substrate from this and subsequent epitaxial layers. Such decoupling reduces the residual thermal and/or lattice mismatch stresses in the epitaxial layers, and is achieved by reducing the effective contact area between substrate and epitaxy.

Typically the two GaN layers are grown by a vapor phase epitaxy technique, e.g., MOCVD or HVPE, and the total thickness of the buffer structure is on the order of one micron, although other growth processes and buffer structure thicknesses are within the scope of the present invention. The individual layers of this structure may also be of different compositions. For example, layers 1309 and 1311 could each consist of GaN, AlN, InN, or an alloy of these constituents; layer 1310 could consist of $SiO_2$, silicon nitride ($Si_3N_4$), polysilicon, refractory metal, or any combination of these components. These are given merely as examples, and are not meant to limit the scope of this embodiment of the present invention; other suitable materials could be used to similar effect. Additionally, each individual layer may consist of a set of sub-layers: layers 1309, 1310, and/or 1311 may each be composed of two or more layers of distinct composition, to further reduce the residual stress levels or to enhance lateral overgrowth. Typical thickness for the lower GaN layer 1309 is on the order of 1 micron; thickness of the patterned mask layer 1310 is on the order of 500 nm; thickness of the upper GaN layer 1311 is on the order of 1–10 microns. Other layer thicknesses that serve to reduce the residual stress or improve the nucleation or lateral overgrowth of layer 1311 are also within the scope of this embodiment of the present invention.

Figure 13A:
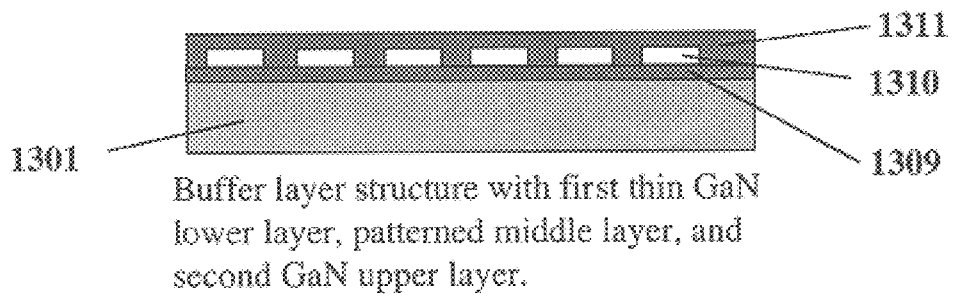
FIGS. 13(a)–13(d) are cross sectional schematic views showing the heteroepitaxial growth of thick and/or freestanding GaN according to a sixth embodiment of the invention.
Figure 13B:
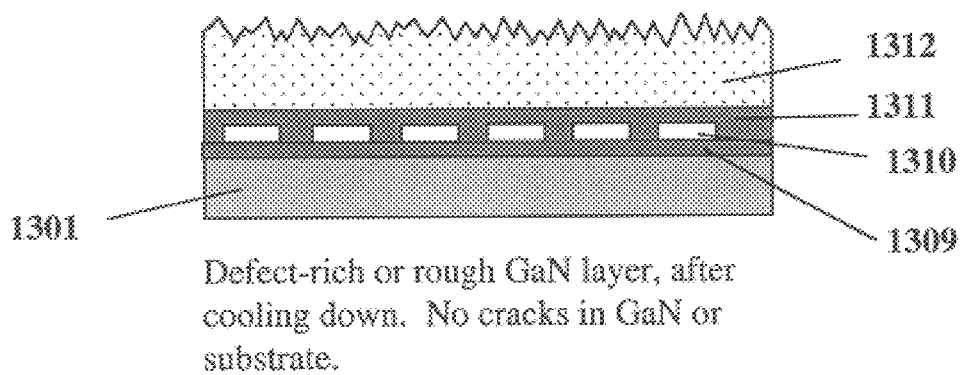
Figure 13C:
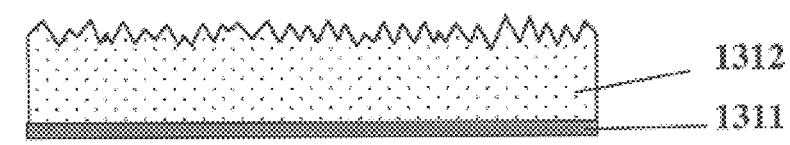
Figure 13D:
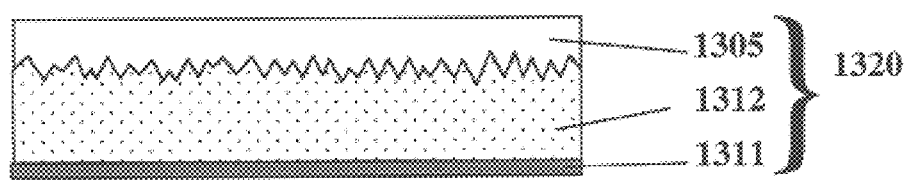

Following the buffer layer structure growth is the deposition of a third, thick, defect-rich or very rough HVPE layer 1312, as shown in FIG. 13(b). After this layer is grown, the sample is cooled to room temperature, removed from the reactor, and sapphire substrate 1 is removed by polishing or some other technique, as shown in FIG. 13(c). Thermal mismatch-induced cracks do not form while cooling because of two complementary effects: the third GaN layer 1312, accommodates the residual stress induced by the sapphire substrate 1, as described in the fourth embodiment of the present invention. Additionally, the patterned mask layer 1310 and lateral overgrowth layer 1311 serve to decouple the thick HVPB layer 1312 from the substrate 1301. Subsequently, the now freestanding GaN layer is reloaded into the reactor and a fourth high quality or very flat GaN layer 1313 is grown onto the third GaN layer 1312 by HVPE as shown in FIG. 13(d). This fourth layer 1313 is grown homoepitaxially; freed of the thermal and lattice mismatch constraints imposed by the sapphire substrate 1301, the film does not crack or experience thermal stress upon cooling down. The result is a high quality freestanding GaN substrate 1320.

Figure 14:
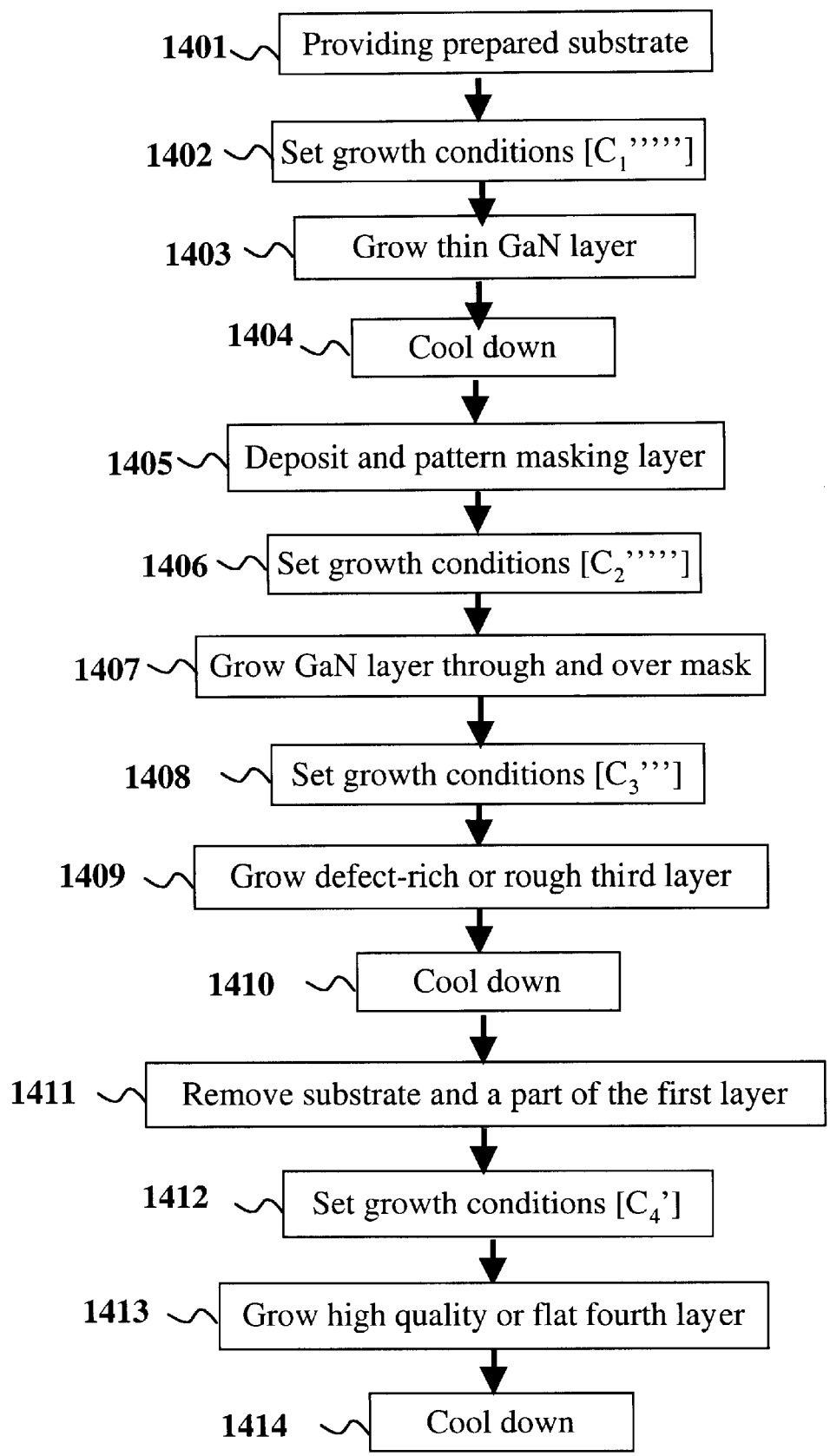
FIG. 14 schematically shows the process steps for the heteroepitaxial growth of thick and/or freestanding GaN in the sixth embodiment of the invention.

FIG. 14 schematically shows the series of steps involved in a method for making a thick a thick, crack-free freestanding GaN substrate, according to the sixth embodiment of this invention. Step 1401 calls for the provision of a prepared substrate. In Step 1402, the process parameters for the growth of the first buffer layer (or layers) are set, hereby denoted as $[C_1'''']$. Parameter set $[C_1'''']$ contains all relevant parameters regarding the growth conditions for the deposition of a buffer layer (or layers). The parameters in $[C_1'''']$ are typically in the same ranges as those described with respect to $[C_1']$ of FIG. 6. Step 1403 calls for the growth of the buffer layer (or layers), e.g. layer 1309 onto the prepared substrate, with a total thickness on the order of 1 micron. In Step 1404, the sample is cooled and removed from the reactor. In Step 1405, a suitable mask material is deposited onto the sample, after which it is patterned using appropriate methods such as lithography and etching to produce a patterned layer such as layer 1310. In step 1406 growth conditions are changed to $[C_2'''']$ for the growth of an ELOG layer (or layers), such as layer 1311. The process of reloading the sample into the growth reactor may also be included in parameter set $[C_2'''']$. In Step 1407 the ELOG layer (or layers) are grown for a typical thickness of 1–10 microns. The parameters in $[C_2'''']$ are typically in the same ranges as those described with respect to $[C_2'']$ of FIG. 8. The ELOG layer is grown through and over the masking layer below it, reducing the effective contact area between the epitaxial overgrowth and the sapphire substrate. In Step 1408 the growth conditions are changed to $[C_3''']$, which may involve the use of a different growth technique than that used in Step 1406, possibly even the use of a different growth system, which may require an additional set of steps for unloading and loading of the sample. Step 1409 calls for the growth of a defect-rich or rough third layer, e.g. layer 1312 onto the buffer layer. The thickness of this layer is preferentially in the range of 20–300 microns. The parameters in $[C_3''']$ are typically in the same ranges as those described with respect to $[C_1]$ of FIG. 4. The conditions $[C_3''']$ are such that the material deposited will have a high defect density or surface roughness, yet will remain essentially epitaxial in nature. In step 1410, the sample is cooled to room temperature without the formation of cracks; the residual stress is minimized due to the effects of the defect-rich or rough second layer as well as the decoupling between the epitaxial layer and the substrate induced by the mask and second layer growth in the buffer structure. Step 1411 calls for the removal of the sapphire substrate to obtain a rough or defect-rich freestanding GaN layer; while the freestanding layer is a single crystal, its defect density and/or roughness make it unsuitable to use as a GaN substrate for device applications. In Step 1412 the growth conditions are changed to $[C_4]$, which includes a set of steps for reloading the sample into the reactor. Step 1413 calls for the deposition of the fourth, high quality, low defect or flat layer atop the third layer, using the growth conditions $[C_4]$. This fourth layer covers the third, burying and isolating the defects, which do not propagate upward during growth. Alternatively, the fourth layer may be grown under conditions favoring lateral epitaxial growth, resulting in growth that smoothes and fills in surface irregularities in the third layer. The thickness of this fourth layer is preferentially in the range of 10–300 microns. In step 1414, the sample is cooled down to room temperature without the formation of cracks; there is no thermal mismatch without the presence of the sapphire substrate, which was removed in Step 1411 to form freestanding substrate 1320.

The foregoing embodiments are exemplary, and should not be construed as limiting the present invention. The present teaching may be applied to other types of apparatuses and methods. The description of the present invention is intended to be illustrative and not limiting the scope of the appended claims. Alternatives, modifications, and variations on this method will be apparent to those skilled in the art.

What is claimed is:

1. A method for the production of a crack-free heteroepitaxial layer comprising the following steps:
   a) providing a substrate
   b) growing a buffer layer on the substrate at a lower temperature than one or more subsequent growths
   c) growing on the buffer layer a defect-rich first epitaxial layer, with reduced residual stress due to the density of defects in this layer
   d) growing a high quality, low defect density second layer atop the first layer, at a growth condition different from that of the defect-rich first epitaxial layer, wherein the low defect density second layer entirely contacts the defect-rich first epitaxial layer.

2. A method, according to claim 1, wherein the growth of the first layer and the second layer are done in-situ, and one or more process conditions are adjusted between growth of the first and second layers to optimize for the growth of the defect-rich first layer and high quality second layer.

3. A method, according to claim 1, where the substrate and the first layer have different lattice constants and/or different coefficients of thermal expansion.

4. A method, according to claim 1, wherein the substrate material is selected from the group consisting of one or more of the following: sapphire, a III–V substrate, gallium arsenide, indium phosphide, gallium phosphide, zinc oxide, magnesium oxide, silicon, a silicon oxide, silicon carbide, lithium aluminate, lithium gallate, and/or lithium aluminum gallate.

5. A method, according to claim 1, wherein the first layer is grown using Vapor-Phase Epitaxy (VPE), or Chemical Vapor Deposition (CVD), or Metal-Organic Chemical Vapor Deposition (MOCVD), or Molecular Beam Epitaxy (MBE), or Hydride Vapor Phase Epitaxy (HVPE).

6. A method, according to claim 1, wherein the second layer is grown using Vapor-Phase Epitaxy (VPE), or Chemical Vapor Deposition (CVD), or Metal-Organic Chemical Vapor Deposition (MOCVD), or Molecular Beam Epitaxy (MBE), or Hydride Vapor Phase Epitaxy (HVPE).

7. A method, according to claim 1, wherein the defect-rich epitaxial layer is made by formation of crystalline facets by adjustment of the growth parameters and/or material composition.

8. A method, according to claim 1, where a defect density of the defect-rich epitaxial layer is determined by a choice of material composition and/or growth parameters.

9. A method, according to claim 1, where the defect-rich first epitaxial layer is of different composition than the second high quality layer.

10. A method, according to claim 1, wherein the first and/or the second layer contains GaN, AlN, InN, or their alloy.

11. A method, according to claim 1, where the crack-free heteroepitaxial layer is over 35 $\mu$m thick.

12. A method, for the production of a crack-free heteroepitaxial layer comprising the following steps:
   a) providing a substrate
   b) growing a defect-rich first epitaxial layer, with reduced residual stress due to the density of defects in this layer
   c) growing a high quality, low defect density second layer atop the first layer, wherein the low defect density second layer entirely contacts the defect-rich first epitaxial layer
wherein the substrate is removed after the growth of the first epitaxial layer.

13. A method, according to claim 1, wherein a thickness of the buffer layer is less than a thickness of the second or the first layer.

14. A method, according to claim 1, wherein two or more of the first, second and buffer layers are done in-situ.

15. The method of claim 14 wherein one or more growth parameters are adjusted to optimize for the growth of one or more of the first, second, and buffer layers.

16. A method, according to claim 1, wherein the buffer layer includes two or more sub-layers each containing GaN, AlN, InN, or their alloy, or zinc oxide or silicon carbide, and that adjacent sub-layers have different lattice constants.

17. A method, according to claim 1, wherein the buffer layer includes two or more layers, one or more of which is a patterned layer.

18. A method, according to claim 17, wherein the patterned layer contains, silicon oxide, silicon nitride, or a mixture of these, silicon, a refractory metal or its oxide or its nitride, or any other suitable refractory material.

19. A method, according to claim 17, wherein the patterned layer includes two or more sub-layers, at least one of which contains silicon oxide, silicon nitride, or a mixture of these, silicon, a refractory metal or its oxide or its nitride, or any other suitable refractory material.

20. A method, for the production of a crack-free heteroepitaxial layer comprising the following steps:
   a) providing a substrate
   b) growing a defect-rich first epitaxial layer, with reduced residual stress due to the density of defects in this layer
   c) growing a high quality, low defect density second layer atop the first layer, wherein the low defect density second layer entirely contacts the defect-rich first epitaxial layer; and
   d) growing a third layer over the substrate before growing the first layer,
wherein the substrate is removed after the growth of the first or second layer.

21. The method of claim 1 wherein the first layer has a rough surface.

22. A method, according to claim 1, wherein the second layer has a smooth surface.

* * * * *